(12) United States Patent
Quimby

(10) Patent No.: US 7,171,629 B2
(45) Date of Patent: Jan. 30, 2007

(54) CUSTOMIZABLE WEB SITE ACCESS SYSTEM AND METHOD THEREFORE

(75) Inventor: David H. Quimby, St. Paul, MN (US)

(73) Assignee: Adaptive Avenue Associates, Inc., St. Paul, MN (US)

( * ) Notice: Subject to any disclaimer, the term of this patent is extended or adjusted under 35 U.S.C. 154(b) by 252 days.

(21) Appl. No.: 10/014,929

(22) Filed: Oct. 22, 2001

(65) Prior Publication Data

US 2002/0199002 A1 Dec. 26, 2002

Related U.S. Application Data

(60) Provisional application No. 60/286,189, filed on Apr. 24, 2001, provisional application No. 60/242,340, filed on Oct. 20, 2000.

(51) Int. Cl.
*G06F 15/00* (2006.01)
*G06F 13/00* (2006.01)

(52) U.S. Cl. .................. 715/854; 715/853; 715/738

(58) Field of Classification Search ............... 345/763, 345/853, 854; 709/203, 209, 229; 707/516; 715/765, 763, 853, 854, 734, 738, 737, 736, 715/851
See application file for complete search history.

(56) References Cited

U.S. PATENT DOCUMENTS 6,049,812 A * 4/2000 Bertram et al. ............ 715/516
6,654,785 B1 * 11/2003 Craig ......................... 709/203
6,904,450 B1 * 6/2005 King et al. ................. 709/203

* cited by examiner

*Primary Examiner*—Cao (Kevin) Nguyen
(74) *Attorney, Agent, or Firm*—Patterson, Thuente, Skaar & Christensen, P.A.

(57) ABSTRACT

A customizable web site access system is comprised of a software program incorporating both a composing portion and a performing portion. The composing portion of the software program is used to create a presentation. The presentation includes a list of URLs for display, a desired sequence of display of the URLs, and a duration of display of the URLs. The performing portion of the software program operates to load and display the presentation to a user of the web in an automatic slide show presentation.

36 Claims, 13 Drawing Sheets

You can specify a duration (minutes and seconds) for each site by entering in the format "mm:ss url" or you can omit the duration and just enter the URL.
  Please enter each site on its own line.
mm:ss url (or just url)

```
http://www.redherring.com
http://www.business2.com
http://thestandard.com
http://www.wired.com
http://www.fastcompany.com
```
— 42

If you omit the duration, what default duration should Surf Gear use?
`00:10` — 44

If you would like Surf Gear to automatically replay your list of sites, please enter the number of times to replay your list, or for continuous replay, enter "Yes" or the letter "Y". `Yes` — 46

In what order would you like your site list played?   Sequential   Random — 48

[   ]   Cancel   Reset

Horizontal Navigation -- Desired Web Site Address List http://www.herring.com
http://www.business2.com
http://www.thestandard.com
http://www.wired.com
http://www.fastcompany.com
http://www.strategy-business.com
http://www.hbr.org
http://www.zdnet.com
http://www.cnet.com
http://cnnfn.cnn.com
http://www.bloomberg.com
http://www.upside.com

FIG. 5

Vertical Navigation -- Desired Web Site Address List http://www.virtualcoast.com
http://www.virtualcoast.com/phil.htm
http://www.virtualcoast.com
http://www.virtualcoast.com/comp.htm
http://www.virtualcoast.com
http://www.virtualcoast.com/projects.htm
http://www.virtualcoast.com/sourcewave/
http://www.virtualcoast.com/projects.htm
http://www.virtualcoast.com/surfgear/
http://www.virtualcoast.com/projects.htm
http://www.virtualcoast.com/cyberecology/
http://www.virtualcoast.com/projects.htm
http://www.virtualcoast.com/ventureplanet/
http://www.virtualcoast.com/projects.htm
http://www.virtualcoast.com/
http://www.virtualcoast.com/bio.htm
http://www.virtualcoast.com/
http://www.virtualcoast.com/partners.htm
http://www.virtualcoast.com/
http://www.virtualcoast.com/public.htm
http://www.virtualcoast.com/virtualmedium/edge.htm
http://www.virtualcoast.com/public.htm
http://news.mpr.org/features/200003/21_catlinb_tech/index.shtml
http://www.virtualcoast.com/public.htm
http://www.virtualcoast.com/
http://www.virtualcoast.com/enviro.htm
http://www.lowertown.org/
http://www.virtualcoast.com/enviro.htm
http://www.virtualcoast.com/virtualmedium/BWWA.htm
http://www.virtualcoast.com/enviro.htm
http://www.virtualcoast.com/
http://www.virtualcoast.com/contact.htm
http://www.virtualcoast.com/geograph.htm

FIG. 7

Google™  Advanced Search  Preferences  Search Tips

[backflip lycos] [Google Search]
[ I'm Feeling Lucky ]

Searched the web for backflip lycos.     Results 1 - 10 of about 6,840. Search took 0.51 seconds.

[ Start Now ] — 84

— 86

TheStandard.com: subjects finance
... Join Backflip: save, discover, organize, & share Web pages. HubStorm: Launch your
net market in NO time! Bidland Systems: Build your own branded auction site ... — 88
www.thestandard.com/article/display/0,1151,18845,00.html - 52k - Cached - Similar pages 86
TheStandard.com: companies
... Lycos Europe. Internet investment firm CMGI owns nearly 17% of Lycos. ... Join Backflip:
save, discover, organize, & share Web pages. HubStorm: Launch your net ...
www.thestandard.com/companies/display/0,2063,48044,00.html - 40k - Cached - Similar pages
[ More results from www.thestandard.com ]

Redherring.com - The house that Lycos builds- February 17,
.... SPONSORED LINKS BACKFLIP: Join Backflip to save, discover, organize, and share
Web pages. It's Free! DEMANDLINE: Where small businesses save $$$$ on LONG ...
www.redherring.com/investor/2000/0217/inv-lycos021700.html - 46k - Cached - Similar pages Redherring.com - Lycos and Terra build new Tower of Babel-
.... SPONSORED LINKS BACKFLIP: Join Backflip to save, discover, organize, and share
Web pages. It's Free! DEMANDLINE: Where small businesses save $$$$ on LONG ...
www.redherring.com/investor/2000/0517/inv-lycosterra051700.html - 45k - Cached - Similar pages
[ More results from www.redherring.com ]

86

Backflip | Press Release
... million AOL members as well as bring into the Backflip team Ron Neuenberger, the
founder of Angelfire, now a Lycos property and currently the 8 th most-visited ... — 88
86 — www.backflip.com/company/out_pr_000420.ihtml - 8k - Cached - Similar pages

Lycos
My Lycos | Site Map. Search for: Advanced Search Parental Controls ... Personalize
Lycos. My Lycos: Sign up | Log in - - - - -. My Investing. Build a Website. ...
www.backflip.com/perl/go.pl?url=911 - 18k - Cached - Similar pages
[ More results from www.backflip.com ]

News: Backflip Leaps Forward With MyBookmarks Buy--April 27,
... has joined the Backflip team. Neuenberger's last venture was the founding of
free Web page service Angelfire, which was acquired by Lycos last year. ...
siliconvalley.internet.com/news/article/1,2198,3531_349411,00.html - 17k - Cached -.Similar pages ZDNet: PC Magazine Talkback
... But you left ... - Stephan Nofield. Thanks for including Backflip i... - David
Goldman. ... Glad you included My Lycos in y... - Greg Farrington. CAFE UTNE RULES ...
www.zdnet.com/tlkbck/comment/221/0,7721,80635-417054,00.html - 65k - Cached - Similar pages NoxGenus Recordings Nijmegen
NoxGenus Recordings Monolith Webserver is Offline!- For Music downloads,
press the logo and you'll be rerouted... Temporary backflip.

FIG. 9 (1 of 2)

members.tripod.lycos.nl/Zquad/ - 2k - Cached - Similar pages

Traffick - The Guide to Portals - Feature Story
... is set up, you will be notified on the My Lycos page when you have new mail, which
will appear in ... FEATURES. PORTAL BASICS >>. ... Backflip this page to find it again. ...
www.traffick.com/story.asp?StoryID=33 - 25k - Cached - Similar pages Gooooooooogle ▶

Result Page:    1 2 3 4 5 6 7 8 9 10    Next

[backflip lycos]    [Google Search]   Search within results
Try your query on: AltaVista Deja Excite HotBot Infoseek Lycos Yahoo!

Google Web Directory - Cool Jobs - Advertise with Us! - Add Google to your Site - Google in your Language -
All About Google

©2000 Google

FIG. 9 (2 of 2)

Item Review Navigation -- Desired Web Site Address List http://www.thestandard.com/article/display/0,1151,18845,00.html
http://www.thestandard.com/companies/display/0,2063,48044,00.html
http://www.redherring.com/investor/2000/0217/inv-lycos021700.html
http://www.redherring.com/investor/2000/0517/inv-lycosterra051700.html
http://www.backflip.com/company/out_pr_000420.ihtml
http://www.backflip.com/perl/go.pl?url=911
http://siliconvalley.internet.com/news/article/1,2198,3531_349411,00.html
http://www.zdnet.com/tlkbck/comment/221/0,7721,80635-417054,00.html
http://members.tripod.lycos.nl/Zquad/
http://www.traffick.com/story.asp?StoryID=33

FIG. 10

CUSTOMIZABLE WEB SITE ACCESS SYSTEM AND METHOD THEREFORE

CLAIM TO PRIORITY

The present application claims priority to U.S. Provisional Application No. 60/242,340, filed Oct. 20, 2000 and entitled "Customizable Web Site Access System and Method Therefore", and to U.S. Provisional Application No. 60/286,189, filed Apr. 24, 2001, and entitled "Customizable Web Site Access System and Method Therefore". Both of the identified provisional patent applications are hereby incorporated by reference in their entirety.

COMPACT DISC

A compact disc containing codes and information describing a preferred embodiment of the present invention is submitted herewith and is hereby incorporated by reference. The compact disc contains the following files and/or programs:

| Title | Size in Bytes | Date of Creation |
| --- | --- | --- |
| _vti_inf.html | 1,759 | Aug. 10, 2001 |
| aboutus.asp | 4,028 | Aug. 10, 2001 |
| composer.asp | 7,698 | Aug. 10, 2001 |
| composer_edit.asp | 17,961 | Aug. 10, 2001 |
| composer_saved.asp | 4,264 | Sep. 20, 2001 |
| contact.htm | 3,364 | Aug. 17, 2001 |
| contactus.asp | 1,509 | Aug. 10, 2001 |
| default.asp | 515 | Aug. 10, 2001 |
| director.asp | 2,752 | Aug. 10, 2001 |
| director_api.asp | 9,608 | Aug. 10, 2001 |
| director_simulator.asp | 5,881 | Aug. 10, 2001 |
| director2.asp | 2,964 | Aug. 10, 2001 |
| error.asp | 1,500 | Aug. 10, 2001 |
| favicon.ico | 7,406 | Aug. 10, 2001 |
| index.asp | 2,172 | Aug. 10, 2001 |
| index.htm | 3,646 | Sep. 20, 2001 |
| index_example.htm | 5,991 | Aug. 10, 2001 |
| index_troy.htm | 3,595 | Aug. 10, 2001 |
| install.asp | 2,837 | Aug. 10, 2001 |
| intruder.asp | 2,778 | Aug. 10, 2001 |
| jsperformer.asp | 17,711 | Aug. 17, 2001 |
| jsperformer.css | 66 | Aug. 10, 2001 |
| jsperformer.js | 6,027 | Aug. 10, 2001 |
| launch.htm | 306 | Aug. 10, 2001 |
| launch2.htm | 1,263 | Aug. 31, 2001 |
| performer.asp | 2,263 | Aug. 10, 2001 |
| performer2.asp | 2,493 | Aug. 10, 2001 |
| postinfo.html | 2,501 | Aug. 10, 2001 |
| promo.asp | 1,934 | Aug. 10, 2001 |
| register.asp | 30,425 | Aug. 23, 2001 |
| signin.asp | 6,415 | Aug. 17, 2001 |
| signout.asp | 2,050 | Aug. 10, 2001 |
| support.asp | 1,288 | Aug. 10, 2001 |
| surfgear.asp | 1,874 | Aug. 10, 2001 |
| form_results.txt | 0 | Aug. 10, 2001 |
| form_results.txt | 1,491 | Aug. 10, 2001 |
| aboutus.asp | 1,650 | Aug. 15, 2001 |
| composer.asp | 2,146 | Sep. 20, 2001 |
| composer_edit.asp | 2,339 | Aug. 15, 2001 |
| composer_saved.asp | 1,876 | Sep. 20, 2001 |
| contact.htm | 1,472 | Aug. 17, 2001 |
| contactus.asp | 1,782 | Aug. 15, 2001 |
| default.asp | 1,800 | Aug. 15, 2001 |
| director.asp | 1,893 | Aug. 31, 2001 |
| director_api.asp | 1,819 | Sep. 20, 2001 |
| director_simulator.asp | 1,723 | Aug. 15, 2001 |
| director2.asp | 1,105 | Aug. 15, 2001 |
| error.asp | 1,674 | Aug. 15, 2001 |
| favicon.ico | 401 | Aug. 10, 2001 |
| index.asp | 1,897 | Sep. 20, 2001 |
| index.htm | 2,016 | Sep. 20, 2001 |
| index_example.htm | 1,732 | Aug. 15, 2001 |
| index_troy.htm | 1,523 | Aug. 15, 2001 |
| install.asp | 2,083 | Sep. 20, 2001 |
| intruder.asp | 1,628 | Aug. 15, 2001 |
| jsperformer.asp | 2,037 | Sep. 20, 2001 |
| jsperformer.css | 779 | Aug. 10, 2001 |
| jsperformer.js | 864 | Aug. 31, 2001 |
| launch.htm | 786 | Aug. 31, 2001 |
| launch2.htm | 783 | Sep. 20, 2001 |
| performer.asp | 1,359 | Aug. 31, 2001 |
| performer2.asp | 1,615 | Aug. 15, 2001 |
| promo.asp | 708 | Aug. 17, 2001 |
| register.asp | 3,457 | Sep. 20, 2001 |
| signin.asp | 2,018 | Aug. 17, 2001 |
| signout.asp | 1,820 | Sep. 20, 2001 |
| support.asp | 1,721 | Aug. 15, 2001 |
| surfgear.asp | 1,603 | Aug. 15, 2001 |
| access.cnf | 128 | Aug. 10, 2001 |
| botinfs.cnf | 146 | Sep. 20, 2001 |
| bots.cnf | 323 | Sep. 20, 2001 |
| deptodoc.bt | 324 | Sep. 20, 2001 |
| doctodep.bt | 84,996 | Sep. 20, 2001 |
| frontpg.lck | 0 | Aug. 10, 2001 |
| linkinfo.cnf | 6,767 | Sep. 20, 2001 |
| service.cnf | 1,436 | Sep. 20, 2001 |
| service.lck | 0 | Sep. 20, 2001 |
| services.cnf | 10 | Aug. 10, 2001 |
| structure.cnf | 92 | Sep. 20, 2001 |
| svcacl.cnf | 66 | Aug. 10, 2001 |
| uniqperm.cnf | 0 | Aug. 10, 2001 |
| writeto.cnf | 25 | Aug. 10, 2001 |
| index.asp | 1,469 | Aug. 10, 2001 |
| site_usage.asp | 2,178 | Aug. 10, 2001 |
| user_edit.asp | 26,884 | Aug. 10, 2001 |
| users.asp | 11,777 | Aug. 10, 2001 |
| index.asp | 1,736 | Aug. 15, 2001 |
| site_usage.asp | 680 | Aug. 15, 2001 |
| user_edit.asp | 2,812 | Aug. 15, 2001 |
| users.asp | 2,148 | Aug. 15, 2001 |
| betty.htm | 19,973 | Aug. 10, 2001 |
| betty.htm | 6,923 | Aug. 15, 2001 |
| 000.gif | 61 | Aug. 10, 2001 |
| app.htm | 3,782 | Sep. 26, 2001 |
| app2.htm | 3,784 | Sep. 20, 2001 |
| avenue.jpg | 12,037 | Aug. 10, 2001 |
| BWWA.jpg | 11,984 | Aug. 10, 2001 |
| composer.htm | 3,672 | Aug. 17, 2001 |
| composer.jpg | 9,440 | Aug. 10, 2001 |
| contact.htm | 3,333 | Aug. 17, 2001 |
| director.htm | 3,335 | Aug. 17, 2001 |
| director.jpg | 6,047 | Aug. 10, 2001 |
| DQ.htm | 3,941 | Aug. 17, 2001 |
| DQ.jpg | 28,094 | Aug. 10, 2001 |
| fee.htm | 3,475 | Aug. 17, 2001 |
| fee.jpg | 9,642 | Aug. 10, 2001 |
| idea.jpg | 5,659 | Aug. 10, 2001 |
| index.htm | 3,688 | Aug. 17, 2001 |
| install.htm | 4,399 | Aug. 10, 2001 |
| install.jpg | 6,150 | Aug. 10, 2001 |
| JS.htm | 3,526 | Aug. 17, 2001 |
| JS.jpg | 15,828 | Aug. 10, 2001 |
| MH.htm | 3,445 | Aug. 17, 2001 |
| MH.jpg | 19,992 | Aug. 10, 2001 |
| performer.htm | 3,433 | Aug. 17, 2001 |
| performer.jpg | 5,551 | Aug. 10, 2001 |
| PR010815.htm | 7,674 | Oct. 11, 2001 |
| PR010829.htm | 6,398 | Oct. 11, 2001 |
| PR010926.htm | 4,258 | Oct. 11, 2001 |
| PR011010.htm | 4,408 | Oct. 11, 2001 |
| product.htm | 3,893 | Sep. 29, 2001 |
| public.htm | 3,522 | Oct. 11, 2001 |
| public.jpg | 5,158 | Sep. 29, 2001 |
| rendition.htm | 3,444 | Aug. 17, 2001 |
| rendition.jpg | 11,622 | Aug. 10, 2001 |
| service.htm | 12,659 | Aug. 17, 2001 |
| service.jpg | 5,158 | Aug. 10, 2001 |

-continued

| Title | Size in Bytes | Date of Creation |
|---|---|---|
| sglogo.gif | 1,067 | Aug. 10, 2001 |
| studio.jpg | 13,747 | Aug. 10, 2001 |
| system.gif | 14,446 | Aug. 10, 2001 |
| system.htm | 2,664 | Aug. 17, 2001 |
| team.htm | 3,492 | Aug. 17, 2001 |
| team.jpg | 24,382 | Aug. 10, 2001 |
| 000.gif | 787 | Sep. 29, 2001 |
| app.htm | 1,960 | Sep. 29, 2001 |
| app2.htm | 1,710 | Sep. 20, 2001 |
| avenue.jpg | 615 | Aug. 11, 2001 |
| BWWA.jpg | 617 | Aug. 17, 2001 |
| composer.htm | 1,489 | Aug. 17, 2001 |
| composer.jpg | 617 | Aug. 11, 2001 |
| contact.htm | 1,596 | Sep. 29, 2001 |
| director.htm | 1,426 | Aug. 17, 2001 |
| director.jpg | 617 | Aug. 11, 2001 |
| DQ.htm | 1,707 | Aug. 17, 2001 |
| DQ.jpg | 612 | Aug. 11, 2001 |
| fee.htm | 1,690 | Sep. 29, 2001 |
| fee.jpg | 612 | Aug. 11, 2001 |
| idea.jpg | 621 | Aug. 17, 2001 |
| index.htm | 1,669 | Sep. 29, 2001 |
| install.htm | 1,805 | Aug. 17, 2001 |
| install.jpg | 616 | Aug. 11, 2001 |
| JS.htm | 1,461 | Aug. 17, 2001 |
| JS.jpg | 612 | Aug. 11, 2001 |
| MH.htm | 1,463 | Aug. 17, 2001 |
| MH.jpg | 612 | Aug. 11, 2001 |
| performer.htm | 1,444 | Aug. 17, 2001 |
| performer.jpg | 618 | Aug. 11, 2001 |
| PR010815.htm | 1,578 | Oct. 11, 2001 |
| PR010829.htm | 1,436 | Oct. 11, 2001 |
| PR010926.htm | 1,448 | Oct. 11, 2001 |
| PR011010.htm | 1,391 | Oct. 11, 2001 |
| product.htm | 1,696 | Sep. 29, 2001 |
| public.htm | 1,440 | Oct. 11, 2001 |
| public.jpg | 517 | Oct. 11, 2001 |
| rendition.htm | 1,438 | Aug. 17, 2001 |
| rendition.jpg | 619 | Aug. 11, 2001 |
| service.htm | 1,362 | Aug. 17, 2001 |
| service.jpg | 605 | Aug. 11, 2001 |
| sglogo.gif | 524 | Aug. 11, 2001 |
| studio.jpg | 617 | Aug. 17, 2001 |
| system.gif | 528 | Aug. 11, 2001 |
| system.htm | 1,401 | Aug. 17, 2001 |
| team.htm | 1,625 | Sep. 29, 2001 |
| team.jpg | 614 | Aug. 11, 2001 |
| __x__todo.htm | 578 | Aug. 10, 2001 |
| __x__todoh.htm | 580 | Aug. 10, 2001 |
| access.cnf | 127 | Aug. 10, 2001 |
| deptodoc.bt | 324 | Oct. 11, 2001 |
| doctodep.bt | 21,492 | Oct. 11, 2001 |
| linkinfo.cnf | 1,065 | Oct. 11, 2001 |
| service.cnf | 1,397 | Oct. 11, 2001 |
| service.lck | 0 | Oct. 11, 2001 |
| services.cnf | 3 | Aug. 10, 2001 |
| structure.cnf | 92 | Aug. 10, 2001 |
| writeto.cnf | 25 | Aug. 10, 2001 |
| __x__todo.htm | 459 | Aug. 10, 2001 |
| __x__todoh.htm | 460 | Aug. 10, 2001 |
| livesurf__vl.asp | 8,155 | Aug. 10, 2001 |
| performer.asp | 8,367 | Aug. 10, 2001 |
| livesurf__vl.asp | 2,786 | Sep. 20, 2001 |
| performer.asp | 2,786 | Sep. 20, 2001 |
| get__page.asp | 3,441 | Aug. 10, 2001 |
| get__page.inc | 4,325 | Aug. 10, 2001 |
| inet.asp | 602 | Aug. 10, 2001 |
| get__page.asp | 2,140 | Aug. 15, 2001 |
| get__page.inc | 1,339 | Aug. 10, 2001 |
| inet.asp | 1,918 | Aug. 15, 2001 |
| database__081001.sql | 3,941 | Aug. 10, 2001 |
| surfgear.DAT | 6,156,416 | Aug. 10, 2001 |
| database__081001.sql | 179 | Aug. 15, 2001 |
| surfgear.DAT | 182 | Aug. 15, 2001 |
| banner__375__50.gif | 2,830 | Aug. 10, 2001 |
| corner__ll.gif | 863 | Aug. 10, 2001 |
| corner__lr.gif | 865 | Aug. 10, 2001 |
| corner__ul.gif | 860 | Aug. 10, 2001 |
| corner__ur.gif | 864 | Aug. 10, 2001 |
| corner20__ul.gif | 887 | Aug. 10, 2001 |
| corner20__ur.gif | 887 | Aug. 10, 2001 |
| edit__button.gif | 1,085 | Aug. 10, 2001 |
| qmark__trans.gif | 933 | Aug. 10, 2001 |
| sglogo.gif | 1,067 | Aug. 10, 2001 |
| space.gif | 55 | Aug. 10, 2001 |
| surfgear__black__dropshadow.jpg | 4,132 | Aug. 10, 2001 |
| surfguy.gif | 983 | Aug. 10, 2001 |
| tour.gif | 3,506 | Aug. 10, 2001 |
| banner__375__50.gif | 1,591 | Aug. 15, 2001 |
| corner__ll.gif | 1,507 | Aug. 15, 2001 |
| corner__lr.gif | 1,507 | Aug. 15, 2001 |
| corner__ul.gif | 1,507 | Aug. 15, 2001 |
| corner__ur.gif | 1,507 | Aug. 15, 2001 |
| corner20__ul.gif | 1,700 | Aug. 15, 2001 |
| corner20__ur.gif | 1,700 | Aug. 15, 2001 |
| edit__button.gif | 1,536 | Aug. 15, 2001 |
| qmark__trans.gif | 1,688 | Aug. 15, 2001 |
| sglogo.gif | 462 | Aug. 15, 2001 |
| space.gif | 1,781 | Aug. 15, 2001 |
| surfgear__black__dropshadow.jpg | 803 | Aug. 15, 2001 |
| surfguy.gif | 1,618 | Aug. 15, 2001 |
| tour.gif | 1,509 | Aug. 15, 2001 |
| webguy108x125.gif | 3,753 | Aug. 10, 2001 |
| webguy74x84.gif | 2,830 | Aug. 10, 2001 |
| world.gif | 5,168 | Aug. 10, 2001 |
| webguy108x125.gif | 1,510 | Aug. 15, 2001 |
| webguy74x84.gif | 1,590 | Aug. 15, 2001 |
| world.gif | 1,593 | Sep. 20, 2001 |
| constants.asp | 6,463 | Aug. 16, 2001 |
| footer.asp | 3,649 | Aug. 10, 2001 |
| header.asp | 4,006 | Aug. 10, 2001 |
| leftnav.asp | 3,605 | Aug. 10, 2001 |
| constants.asp | 1,656 | Aug. 16, 2001 |
| footer.asp | 2,164 | Aug. 15, 2001 |
| header.asp | 2,317 | Aug. 15, 2001 |
| leftnav.asp | 1,147 | Aug. 15, 2001 |
| install.reg | 984 | Aug. 10, 2001 |
| performer.exe | 77,824 | Aug. 10, 2001 |
| performer__105.exe | 49,152 | Aug. 10, 2001 |
| SGEngine4.exe | 40,960 | Aug. 10, 2001 |
| surfsettings.reg | 134 | Aug. 10, 2001 |
| install.reg | 1,056 | Aug. 10, 2001 |
| performer.exe | 493 | Aug. 10, 2001 |
| performer__105.exe | 1,047 | Aug. 10, 2001 |
| SGEngine4.exe | 1,285 | Aug. 10, 2001 |
| surfsettings.reg | 1,283 | Aug. 10, 2001 |
| surfgear.zip | 22,319 | Aug. 10, 2001 |
| surfgear.zip | 1,205 | Aug. 10, 2001 |
| __director.asp | 8,843 | Aug. 10, 2001 |
| __director2.asp | 2,726 | Aug. 10, 2001 |
| 1.0__jsperformer.asp | 11,929 | Aug. 10, 2001 |
| 1.0__jsperformer.js | 6,453 | Aug. 10, 2001 |
| 1.0__performer.asp | 1,853 | Aug. 10, 2001 |
| 1.01__director.asp | 3,964 | Aug. 10, 2001 |
| 1.01__jsperformer.asp | 16,383 | Aug. 10, 2001 |
| 1.01__jsperformer.js | 6,151 | Aug. 10, 2001 |
| 1.01__performer.asp | 3,209 | Aug. 10, 2001 |
| aboutus.asp | 6,220 | Aug. 10, 2001 |
| contactus.asp | 3,676 | Aug. 10, 2001 |
| director.asp | 2,730 | Aug. 10, 2001 |
| dsim.html | 13,407 | Aug. 10, 2001 |
| get__page.asp | 3,462 | Aug. 10, 2001 |
| get__page.inc | 4,325 | Aug. 10, 2001 |
| index.asp | 4,733 | Aug. 10, 2001 |
| inet.asp | 602 | Aug. 10, 2001 |
| jsperformer.asp | 16,781 | Aug. 10, 2001 |
| jsperformer.js | 6,027 | Aug. 10, 2001 |
| launch.htm | 306 | Aug. 10, 2001 |
| livesurf.asp | 1,992 | Aug. 10, 2001 |
| livetest.asp | 4,041 | Aug. 10, 2001 |
| org__surf.asp | 8,079 | Aug. 10, 2001 |
| performer.asp | 2,258 | Aug. 10, 2001 |
| register.asp | 21,170 | Aug. 10, 2001 |
| scripts.asp | 9,303 | Aug. 10, 2001 |

-continued

| Title | Size in Bytes | Date of Creation |
|---|---|---|
| signin.asp | 8,020 | Aug. 10, 2001 |
| support.asp | 3,456 | Aug. 10, 2001 |
| surf.asp | 8,429 | Aug. 10, 2001 |
| surfgear.asp | 1,874 | Aug. 10, 2001 |
| troy__surf.asp | 8,124 | Aug. 10, 2001 |
| vb__install.asp | 5,634 | Aug. 10, 2001 |
| vbsurf.asp | 2,093 | Aug. 10, 2001 |
| __director.asp | 1,830 | Sep. 20, 2001 |
| __director2.asp | 619 | Aug. 15, 2001 |
| 1.0__jsperformer.asp | 1,704 | Sep. 20, 2001 |
| 1.0__jsperformer.js | 481 | Aug. 10, 2001 |
| 1.0__performer.asp | 793 | Aug. 15, 2001 |
| 1.01__director.asp | 793 | Aug. 15, 2001 |
| 1.01__jsperformer.asp | 1,700 | Sep. 20, 2001 |
| 1.01__jsperformer.js | 481 | Aug. 10, 2001 |
| 1.01__performer.asp | 793 | Aug. 15, 2001 |
| aboutus.asp | 2,692 | Sep. 20, 2001 |
| contactus.asp | 2,788 | Aug. 15, 2001 |
| director.asp | 859 | Aug. 15, 2001 |
| dsim.html | 3,613 | Sep. 20, 2001 |
| get__page.asp | 2,167 | Aug. 15, 2001 |
| get__page.inc | 1,339 | Aug. 10, 2001 |
| index.asp | 2,665 | Aug. 15, 2001 |
| inet.asp | 1,918 | Aug. 15, 2001 |
| jsperformer.asp | 1,949 | Sep. 20, 2001 |
| jsperformer.js | 801 | Aug. 10, 2001 |
| launch.htm | 677 | Aug. 15, 2001 |
| livesurf.asp | 1,105 | Aug. 15, 2001 |
| livetest.asp | 1,729 | Aug. 15, 2001 |
| org__surf.asp | 2,079 | Sep. 20, 2001 |
| performer.asp | 1,092 | Aug. 15, 2001 |
| register.asp | 3,841 | Aug. 15, 2001 |
| scripts.asp | 3,015 | Aug. 15, 2001 |
| signin.asp | 2,771 | Aug. 15, 2001 |
| support.asp | 2,722 | Aug. 15, 2001 |
| surf.asp | 2,786 | Sep. 20, 2001 |
| surfgear.asp | 1,603 | Aug. 15, 2001 |
| troy__surf.asp | 2,051 | Sep. 20, 2001 |
| vb__install.asp | 2,982 | Aug. 15, 2001 |
| vbsurf.asp | 1,619 | Aug. 15, 2001 |
| livesurf__api.asp | 15,268 | Aug. 10, 2001 |
| livesurf__api.asp | 3,906 | Sep. 20, 2001 |
| datamodel.mdb | 169,984 | Aug. 10, 2001 |
| datamodel.mdb | 1,206 | Aug. 10, 2001 |
| banner__375__50.gif | 2,830 | Aug. 10, 2001 |
| corner__ll.gif | 863 | Aug. 10, 2001 |
| corner__lr.gif | 865 | Aug. 10, 2001 |
| corner__ul.gif | 860 | Aug. 10, 2001 |
| corner__ur.gif | 864 | Aug. 10, 2001 |
| corner20__ul.gif | 887 | Aug. 10, 2001 |
| corner20__ur.gif | 887 | Aug. 10, 2001 |
| edit__button.gi | 1,085 | Aug. 10, 2001 |
| qmark__trans.gif | 933 | Aug. 10, 2001 |
| space.gif | 55 | Aug. 10, 2001 |
| surfguy.gif | 983 | Aug. 10, 2001 |
| tour.gif | 3,506 | Aug. 10, 2001 |
| banner__375__50.gif | 1,540 | Aug. 15, 2001 |
| corner__ll.gif | 1,507 | Aug. 15, 2001 |
| corner__lr.gif | 1,507 | Aug. 15, 2001 |
| corner__ul.gif | 1,507 | Aug. 15, 2001 |
| corner__ur.gif | 1,507 | Aug. 15, 2001 |
| corner 20__ul.gif | 1,575 | Aug. 15, 2001 |
| corner 20__ur.gif | 1,575 | Aug. 15, 2001 |
| edit__button.gif | 1,524 | Aug. 15, 2001 |
| qmark__trans.gif | 1,609 | Aug. 15, 2001 |
| space.gif | 1,766 | Aug. 15, 2001 |
| surfguy.gif | 1,561 | Aug. 15, 2001 |
| tour.gif | 1,509 | Aug. 15, 2001 |
| webguy108x125.gif | 3,753 | Aug. 10, 2001 |
| webguy74x84.gif | 2,830 | Aug. 10, 2001 |
| world.gif | 5,168 | Aug. 10, 2001 |
| webguy108x125.gif | 1,510 | Aug. 15, 2001 |
| webguy74x84.gif | 1,539 | Aug. 15, 2001 |
| world.gif | 1,509 | Aug. 15, 2001 |
| constants.asp | 6,039 | Aug. 10, 2001 |
| header.asp | 3,814 | Aug. 10, 2001 |
| leftnav.asp | 3,608 | Aug. 10, 2001 |

-continued

| Title | Size in Bytes | Date of Creation |
|---|---|---|
| constants.asp | 1,603 | Aug. 15, 2001 |
| header.asp | 2,490 | Aug. 15, 2001 |
| leftnav.asp | 1,243 | Aug. 15, 2001 |
| install.reg | 961 | Aug. 10, 2001 |
| SGEngine4.exe | 40,960 | Aug. 10, 2001 |
| surfgear.exe | 49,152 | Aug. 10, 2001 |
| surfsettings.reg | 134 | Aug. 10, 2001 |
| install.reg | 1,064 | Aug. 10, 2001 |
| SGEngine4.exe | 1,285 | Aug. 10, 2001 |
| surfgear.exe | 1,066 | Aug. 10, 2001 |
| surfsettings.reg | 1,283 | Aug. 10, 2001 |
| ex0108.log | 630,077 | Aug. 10, 2001 |
| ex0108.log | 403 | Aug. 10, 2001 |
| aboutus.asp | 6,220 | Aug. 10, 2001 |
| contactus.asp | 3,676 | Aug. 10, 2001 |
| default.asp | 515 | Aug. 10, 2001 |
| error.asp | 3,816 | Aug. 10, 2001 |
| get__page.asp | 3,462 | Aug. 10, 2001 |
| get__page.inc | 4,325 | Aug. 10, 2001 |
| index.asp | 4,733 | Aug. 10, 2001 |
| inet.asp | 602 | Aug. 10, 2001 |
| livesurf.asp | 1,992 | Aug. 10, 2001 |
| livetest.asp | 4,041 | Aug. 10, 2001 |
| register.asp | 21,175 | Aug. 10, 2001 |
| script__edit.asp | 17,276 | Aug. 10, 2001 |
| script__saved.asp | 7,669 | Aug. 10, 2001 |
| scripts.asp | 9,170 | Aug. 10, 2001 |
| signin.asp | 8,020 | Aug. 10, 2001 |
| support.asp | 3,456 | Aug. 10, 2001 |
| surf.asp | 8,079 | Aug. 10, 2001 |
| surfgear.asp | 1,874 | Aug. 10, 2001 |
| vb__install.asp | 5,634 | Aug. 10, 2001 |
| vbsurf.asp | 2,093 | Aug. 10, 2001 |
| aboutus.asp | 3,101 | Sep. 20, 2001 |
| contactus.asp | 3,223 | Aug. 15, 2001 |
| default.asp | 1,800 | Aug. 15, 2001 |
| error.asp | 2,783 | Aug. 15, 2001 |
| get__page.asp | 2,245 | Aug. 15, 2001 |
| get__page.inc | 1,339 | Aug. 10, 2001 |
| index.asp | 3,039 | Aug. 15, 2001 |
| inet.asp | 1,918 | Aug. 15, 2001 |
| livesurf.asp | 1,105 | Aug. 15, 2001 |
| livetest.asp | 1,768 | Aug. 15, 2001 |
| register.asp | 4,432 | Aug. 15, 2001 |
| script__edit.asp | 3,539 | Aug. 15, 2001 |
| script__saved.asp | 3,147 | Aug. 15, 2001 |
| scripts.asp | 3,531 | Aug. 15, 2001 |
| signin.asp | 3,070 | Aug. 15, 2001 |
| support.asp | 3,116 | Aug. 15, 2001 |
| surf.asp | 3,074 | Sep. 20, 2001 |
| surfgear.asp | 1,603 | Aug. 15, 2001 |
| vb__install.asp | 3,268 | Aug. 15, 2001 |
| vbsurf.asp | 1,632 | Aug. 15, 2001 |
| livesurf__api.asp | 15,268 | Aug. 10, 2001 |
| livesurf__api.asp | 4,361 | Sep. 20, 2001 |
| datamodel.mdb | 169,984 | Aug. 10, 2001 |
| datamodel.mdb | 1,206 | Aug. 10, 2001 |
| banner__375__50.gif | 2,830 | Aug. 10, 2001 |
| corner__ll.gif | 863 | Aug. 10, 2001 |
| corner__lr.gif | 865 | Aug. 10, 2001 |
| corner__ul.gif | 860 | Aug. 10, 2001 |
| corner__ur.gif | 864 | Aug. 10, 2001 |
| corner20__ul.gif | 887 | Aug. 10, 2001 |
| corner20__ur.gif | 887 | Aug. 10, 2001 |
| edit__button.gif | 1,085 | Aug. 10, 2001 |
| qmark__trans.gif | 933 | Aug. 10, 2001 |
| space.gif | 55 | Aug. 10, 2001 |
| surfguy.gif | 983 | Aug. 10, 2001 |
| tour.gif | 3,506 | Aug. 10, 2001 |
| banner__375__50.gif | 1,553 | Aug. 15, 2001 |
| corner__ll.gif | 1,507 | Aug. 15, 2001 |
| corner__lr.gif | 1,507 | Aug. 15, 2001 |
| corner__ul.gif | 1,507 | Aug. 15, 2001 |
| corner__ur.gif | 1,507 | Aug. 15, 2001 |
| corner20__ul.gif | 1,578 | Aug. 15, 2001 |
| corner20__ur.gif | 1,578 | Aug. 15, 2001 |
| edit__button.gif | 1,537 | Aug. 15, 2001 |

-continued

| Title | Size in Bytes | Date of Creation |
| --- | --- | --- |
| qmark_trans.gif | 1,672 | Aug. 15, 2001 |
| space.gif | 1,996 | Aug. 15, 2001 |
| surfguy.gif | 1,564 | Aug. 15, 2001 |
| tour.gif | 1,543 | Aug. 15, 2001 |
| webguy108x125.gif | 3,753 | Aug. 10, 2001 |
| webguy74x84.gif | 2,830 | Aug. 10, 2001 |
| world.gif | 5,168 | Aug. 10, 2001 |
| webguy108x125.gif | 1,510 | Aug. 15, 2001 |
| webguy74x84.gif | 1,552 | Aug. 15, 2001 |
| world.gif | 1,509 | Aug. 15, 2001 |
| constants.asp | 5,875 | Aug. 10, 2001 |
| header.asp | 3,823 | Aug. 10, 2001 |
| leftnav.asp | 3,608 | Aug. 10, 2001 |
| constants.asp | 1,603 | Aug. 15, 2001 |
| header.asp | 2,386 | Aug. 15, 2001 |
| leftnav.asp | 1,308 | Aug. 15, 2001 |
| install.reg | 961 | Aug. 10, 2001 |
| SGEngine4.exe | 40,960 | Aug. 10, 2001 |
| surfgear.exe | 49,152 | Aug. 10, 2001 |
| surfsettings.reg | 134 | Aug. 10, 2001 |
| install.reg | 1,077 | Aug. 10, 2001 |
| SGEngine4.exe | 1,285 | Aug. 10, 2001 |
| surfgear.exe | 1,079 | Aug. 10, 2001 |
| surfsettings.reg | 1,283 | Aug. 10, 2001 |

FIELD OF THE INVENTION

The present invention relates to the manner in which a user and/or developer of the World Wide Web presents and/or accesses a web site and, more specifically, to a system and method to enable multiple types of automated navigation through a plurality of web site addresses.

BACKGROUND OF THE INVENTION

Currently, various web site owners and developers are attempting to captivate their audience with cutting-edge presentations through large investments in animation and streaming media. Those investments have decayed rapidly as the content of the site changes and becomes obsolete. However, without attempting to use these types of costly presentations, web site owners and developers must passively accept the random paths through the available content that visitors to the site choose to review, resulting in a significant amount of site content that is never seen.

From a user's perspective, access to the World Wide Web is most often achieved by accessing a single-source, static destination, e.g., a single web site address, and navigating vertically through multiple pages at a single destination by selecting navigational links within a web page. Alternatively, the user utilizes the results list of a search engine to access the various web sites that are directed to the user's topic of interest. To review numerous web sites in the results list, the user must continually return from the topic site to the list to reach the next web page link making navigation of the sites an often unnecessarily lengthy and tedious task.

As such, there is a need for a web site access system that enables web site owners and developers to provide an automated presentation of desired web page sequences without the costs of reprogramming site content or installing development tools, and that enables web site users to adjust those presentations to their preferences and/or enact their own presentation of web sites of interest, such as through the use of search engine results.

SUMMARY OF THE INVENTION

The needs described above are in large measure addressed by the customizable web site access system of the present invention. The system is comprised of a software program incorporating both a composing portion and a performing portion. The composing portion of the software program is used to create a presentation. The presentation includes a list of URLs for display, a desired sequence of display of the URLs, and a duration of display of the URLs. The performing portion of the software program operates to load and automatically display the presentation to a user of the web according to the URL list, sequence of display, and duration of display.

The performing portion of the software program also preferably provides a control panel whereby a web user can not only pause or stop the presentation but can also change the sequence and/or duration of display of each of the URLs of the presentation. The use of the software program of the present invention enables various types of navigation through the web including horizontal navigation, vertical navigation, or item navigation of web sites.

BRIEF DESCRIPTION OF THE DRAWINGS

FIG. 3 is an example of a web page for the entry of desired user data to be implemented through the customizable web site access system of the present invention.

FIG. 5 is an example of a horizontal navigation web site address list.

FIG. 7 is an example of a vertical navigation web site address list.

FIG. 9 (pages 1 and 2) depicts a typical search result list of a search performed by a search engine.

FIG. 10 is an example of an item navigation web site address list corresponding to the search results of FIG. 9.

DETAILED DESCRIPTION OF THE PREFERRED EMBODIMENTS

The web site access system of the present invention enables site owners and developers to create, in a matter of minutes, automated and customized presentations of multiple web pages that dynamically present more content in less time to users without the expense of any new development. The web site access system of the present invention operates to combine the bookmark feature of web browsers with the slide show feature of presentation software. With the present invention, site owners and developers can easily change the page sequence, adjust the timing, and add an audio overlay to the web presentation. At the same time, a user visiting a site can view those presentations of interest at their desired pace and a user presented with a search engine results list can view the list's web sites in an automated, sequential fashion without returning continuously to the original search engine results list.

Figure 1:
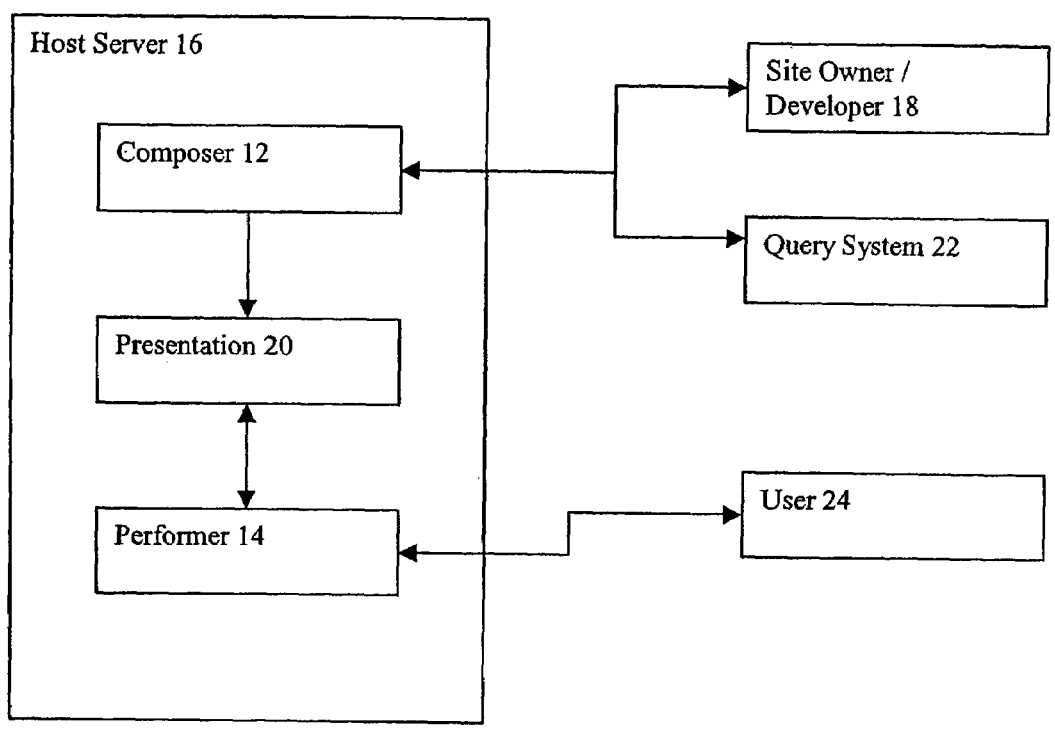
FIG. 1 is a block diagram depicting a customizable web site access system of the present invention.

FIG. 1 provides an overview block diagram of the system architecture of the customizable web site access system 10 of the present invention. As shown, system 10 is a software program incorporating two main components, a composer 12 and a performer 14 that are preferably stored on a host server 16. Composer 12 may be manually invoked by a site owner/developer 18 to create a customized presentation 20 of multiple web pages or may be automatically invoked by a query-based system 22, e.g., search engine, to create a customized presentation of the multiple web pages resulting from a query. In either instance, the URLs of the sites that comprise the presentation and the corresponding options of the presentation, e.g., sequence of the URLs, the duration that each is to be displayed, whether the sequence is to be continuously repeated, etc., are stored on the host server 16 or, alternatively, sent directly to the performer 14 for display via a programming interface.

The performer 14 is that portion of the software of system 10 that a user/visitor 24 to the web utilizes to access and view the customized presentation 20. The performer 14 may be activated by a user 24 by simply entering a web site, by selecting a site from a directory of sites, by selecting a hyperlink embedded within a message, by selecting a certain presentation 20 from a gallery of presentations 20, etc. Essentially, any manner of reaching a web site can be established as the invoker of the performer 14. Upon invoking the performer 14, the user 24 is not only provided with the presentation 20 but is also provided by the performer with the ability to modify the presentation 20 to their desires, e.g., pausing on a certain page, escaping/canceling the performer, changing the sequence of pages displayed, and changing the duration of pages displayed.

Figure 2A:
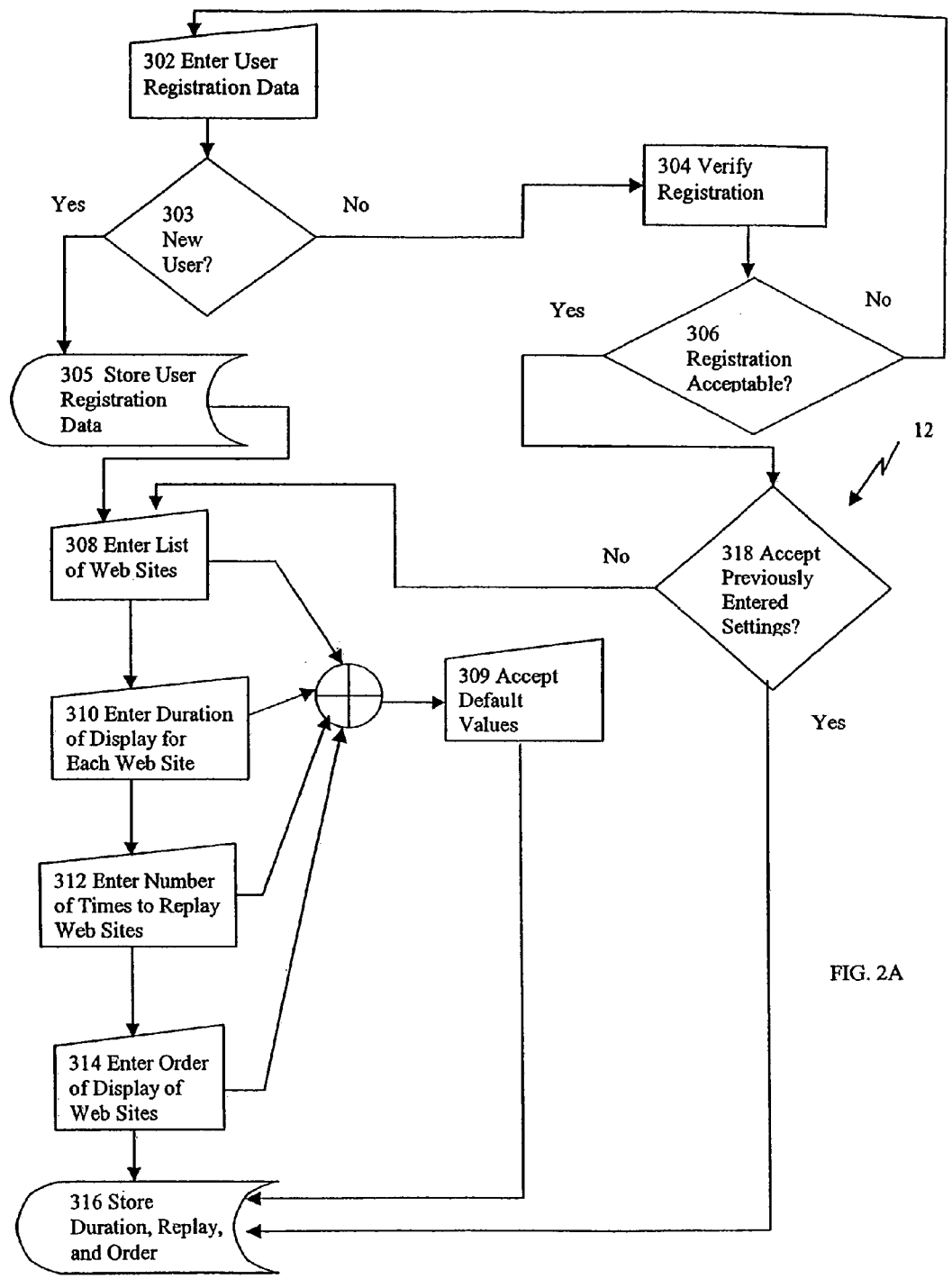
FIG. 2A is a flow chart depicting the operation of the composer portion of the customizable web site access system of the present invention.

A flowchart depicting the preferred operation of the composer 12 is shown in FIG. 2A. As indicated, per input block 302, composer 12 preferably prompts the site owner/developer to enter owner registration information. The owner registration information may be in the form of a name, password, or other type of user identifier. The owner registration information is then used to determine whether the registrant is a new registrant, per decision block 303. If the registrant is new, a new registrant identifier is stored at the host server 16, per stored data block 305, and the new registrant is prompted to enter their desired preferences for their presentation 20 (as described per option one below). If the registrant is not new, the registration identifier is verified, per operations block 304, to determine if the registration data corresponds to previously entered registration data that is stored on host server 16.

If the entered registration data does not correspond to previously entered registration data, per decision block 306, the site owner/developer is requested to enter their owner registration information again, per input block 302. However, if the entered registration data does correspond to previously entered registration data, per decision block 306, the site owner/developer is provided with two options: (1) modifying their previously entered desired presentation preferences; or (2) using the previously entered settings, per decision block 318.

Option one follows the left-hand side of the flowchart of FIG. 2A and, as shown, the site owner/developer is requested to input/modify their desired settings. Specifically, the site owner/developer is requested to input their desired list of web sites through which they would like system 10 to sequence, per input block 308. The manner of input may be an interactive user interface, e.g., the user enters the list through a keyboard, or it may be a previously existing text file containing a plurality of web addresses that is retrieved as a parameter list by an automatic operation of composer 12. Still another manner of input may be the results list of a search engine or data base query. The results list may be entered as a parameter list by an automatic operation of composer 12, e.g., composer 12 automatically receives the results list of web site addresses and produces a corresponding presentation 20. Alternatively, the site owner/developer may accept the default values of system 10, per input block 309. In the preferred embodiment of the present invention, the site owner/developer is provided with all above-described options for entering a desired list of web site addresses. Of course, numerous other manners of entering a desired list of web site addresses may be used without departing from the spirit or scope of the invention.

Per the flowchart of FIG. 2A, the site owner/developer is also requested to input the desired duration of display for each listed web site, per input block 310, or accept the default values of system 10, per input block 309. Alternatively, the site owner/developer may enter a default duration to be used with each listed web site.

The site owner/developer is further requested to enter the number of times they would like the performer 14 of system 10 to replay their entered list of web sites, per input block 312, or accept the default values of system 10, per input block 309. Alternatively, the site owner/developer may simply enter that they wish their entered list of web sites to be continuously replayed. The site owner/developer is also requested to enter the order in which they would like their entered list of web sites to be displayed, i.e., in sequential order (the order in which the site owner/developer entered the web sites in their list) or in random order, per input block 314, or accept the default values of system 10, per input block 309. Whether the preferences comprise new settings, previously entered settings (decision block 318) or default values, each of the preferences is stored on the host server 16, per stored data block 316.

Option two, as mentioned above, comprises using the previously entered settings, per decision block 318.

Figure 2B:
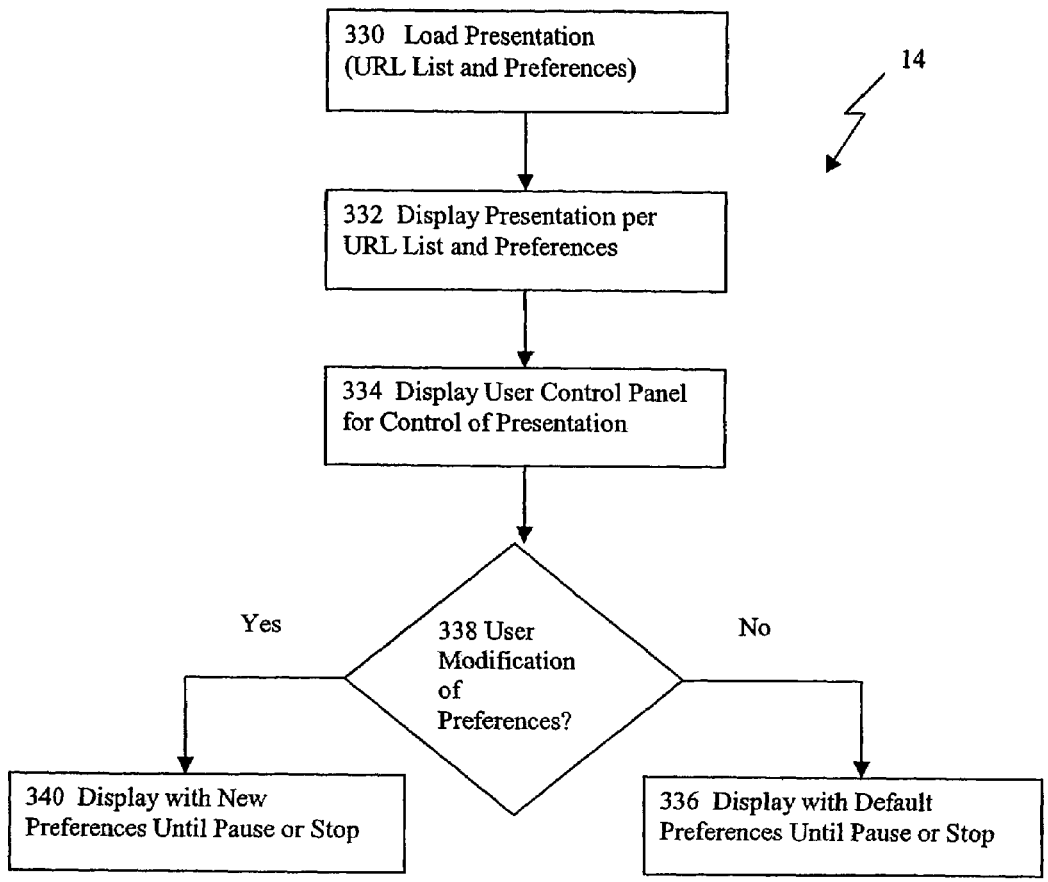
FIG. 2B is a flow chart depicting the operation of the performer portion of the customizable web site access system of the present invention.

A flowchart depicting the preferred operation of the performer 14 is shown in FIG. 2B. Up on being activated by the selection of a presentation 20 or by the initiation of a presentation 20, the performer 14 operates to load the presentation 20 including the URLs and presentation preferences, per operations block 330, and to sequence through the URLs with display to the user 24, per operations block 332. The performer 14 may be activated by the user 24 selecting the presentation 20 from a gallery of presentations, by the user 24 entering a web site that has been pre-configured with the composer 12 through activation of a hyperlink within another web site or e-mail message, by the user 24 opening an e-mail message with a hyperlink that activates the composer 12 directly, or by the user 24 performing a query with a results listing that automatically (or manually) activates the performer 12. The performer 14 additionally operates to present the user with a generic, presentation-independent control panel, per operations block 334, such as the system-interactive user area 54 of FIG. 4. The performer 14 continues to sequence through the URLs with the default presentation settings until the presentation 20 is paused or stopped by the user, per operations block 336. Alternatively, if the user 24 has modified the presentation settings, per decision block 338, the performer 14 continues the presentation 20 with the new presentation settings until the presentation 20 is stopped or paused by the user 24, per operations block 340.

In the preferred embodiment of system 10, and when using the composer 12, the site owner/developer is prompted to enter their presentation settings via interaction with a data entry screen 40, an example of which is shown in FIG. 3. Data entry screen 40 preferably includes a web site list field 42 that allows the site owner/developer to enter a web site address (URL) and a duration of display in a minute and second format (mm:ss). Data entry screen 40 also preferably includes a default duration field 44 should the site owner/developer not desire to enter a specific display time for each entered web site address. Data entry screen 40 also preferably includes a replay field 46 to indicate the number of times to replay the list of desired web sites, or to indicate a continuous replay, and preferably includes an order field 48 to indicate sequential or random display. Of course, numerous other manners of obtaining a site owner/developer's preferences may be used without departing from the spirit or scope of the invention.

Figure 4:
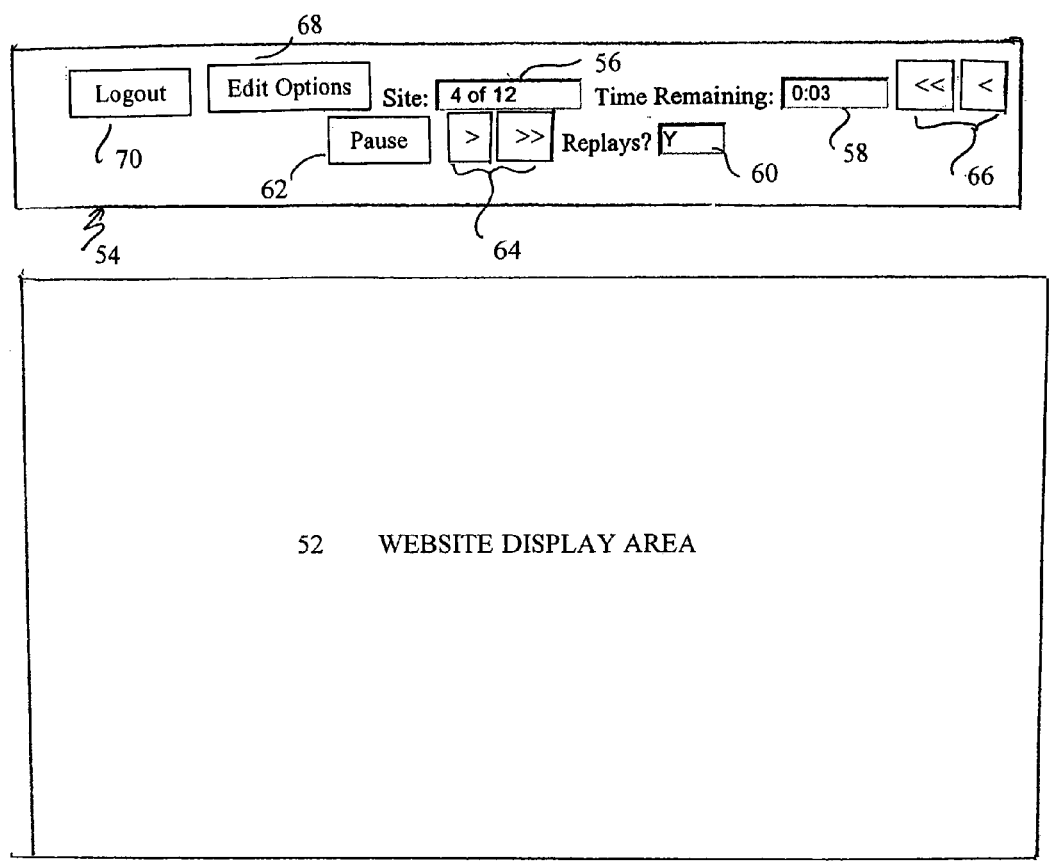
FIG. 4 is an example of a header that may be displayed at the top of each web site accessed by the system of the present invention.

Upon displaying a site owner/developer's list of desired web sites per the operation of the performer 14, system 10 preferably utilizes a display screen 50. An example of such a display screen is shown in FIG. 4. Display screen 50 includes a web site display area 52 and a system-interactive user area 54. System-interactive user area 54 preferably includes a site field 56, a time remaining field 58, and a replay field 60. System-interactive user area 54 also preferably includes a pause button 62, a site-forward button 64, a site-backward button 66, an edit options button 68, and a logout button 70.

Site field 56 provides an indication of the total number of web sites within a site owner/developer's entered URL list and an indication of the current web site's location within the list, e.g., 4 of 12. Time remaining field 58 provides an indication of how much longer the current web site will be displayed before system 10 displays the next web site. Replay field 60 provides an indication of the requested number of replays for the entered web site list, or whether the replay is to be continuous.

Pause button 62 enables a user of system 10 to stop the sequencing of the list of web sites and maintain the currently presented web site. Site-forward button 64 enables a user of system 10 to go to the next web site in the user-entered list or to go to the very last web site in the list. Site-backward button 66 similarly enables the user of system 10 to go to the previous web site in the user-entered list or to go to the very first web site in the list. Edit options button 68 enables a user of system 10 to re-access data entry screen 40 to modify entered preferences. Logout button 70 enables a user of system 10 to exit system 10 and return to vertical navigation of web sites. Of course, numerous other manners of interacting with the web site display of system 10 may be used without departing from the spirit or scope of the invention.

It should be noted that while the present invention has been described with the composer 12 being utilized by only a site owner/developer, a user may utilize the composer 12 to create their own personalized presentation of web favorites.

Horizontal Navigation

The system 10 of the present invention may be used to achieve horizontal navigation of a plurality of web site addresses. An example of a horizontal navigation web site address list, as would be entered into web site list field 42 through use of the composer 12, is provided in FIG. 5. As can be seen, each web site address represents a new and distinct address that would likely be unreachable via links in the other web site addresses. Thus, without the present invention, each address would have to be entered separately by a user, requiring considerable time. However, with the present invention, the user can be presented with a slide show, capable of being stopped at any desired moment, of unrelated sites that may address multiple or single topics of interest. The user's experience in accessing the World Wide Web becomes analogous to browsing several publications sequentially instead of reading a single publication in its entirety, i.e., accessing a single-source, static-destination web site.

Vertical Navigation

Figure 6:
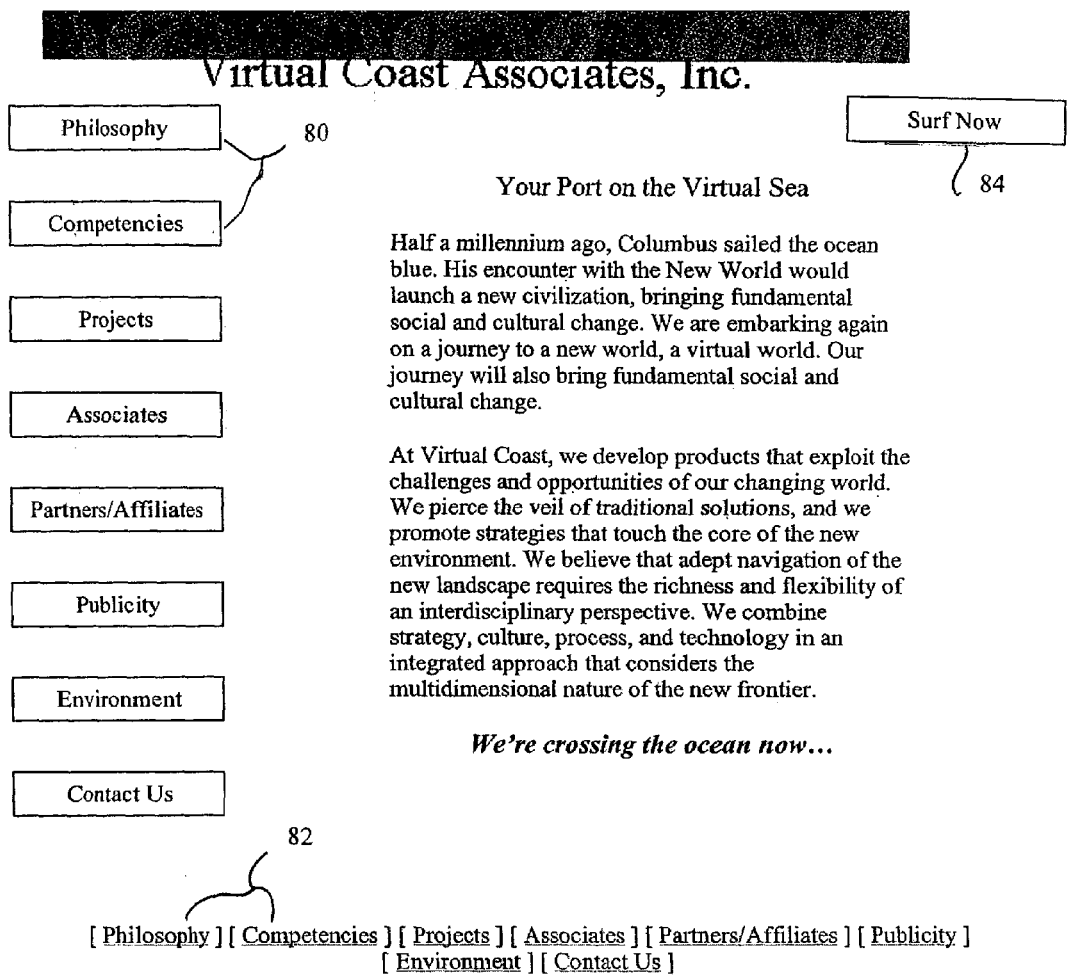
FIG. 6 depicts a typical web site home page incorporating a plurality of links to other web pages within the web site.

The system 10 of the present invention may be used to achieve vertical navigation of a plurality of web site addresses. FIG. 6 depicts a typical web home page wherein numerous links to other pages within the web site are presented to the user, e.g., in the form of buttons 80 or keyword links 82. Upon selecting a link, the corresponding web page address is presented to the user. As such, to reach the various linked pages within the web site and/or to drill through the multiple layers of web pages that may be present in the web site, the user must select the link for each individual page. If a desired web page resides multiple layers of pages from the home page, the user must traverse each intermediate layer before finally reaching the desired web page.

Figure 8:
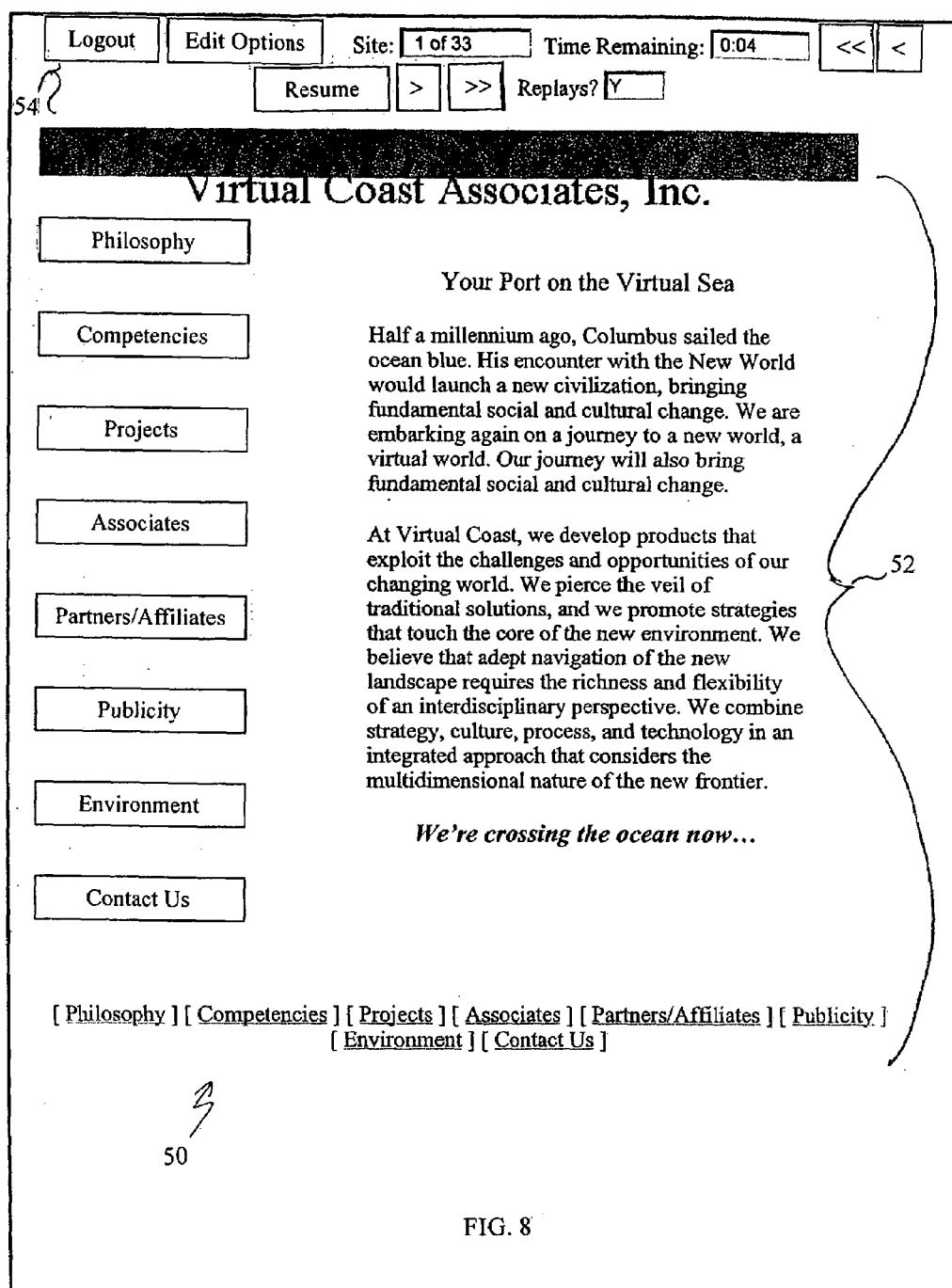
FIG. 8 depicts the web site of FIG. 6, wherein the present invention has been invoked, provides a display screen, and presents a slide show of the linked web pages within the web site.

However, upon invoking the present invention, e.g., by selecting the activator 84, the various links within the web site are written to web site list field 42 by automatic operation of the composer 12, and a slide show presentation of the various pages within the web site may begin. An example of a vertical navigation web site address list, wherein the plurality of links within a single web site are provided, is presented in FIG. 7. Once invoked, the present invention exhibits display screen 50 to the user, incorporating web site display area 52 and system-interactive user area 54, and presents a slide show of the linked web pages within the web site as depicted in FIG. 8 to the user 24 of the performer 14. The user 24 may, of course, pause on any web page desired for any amount of time and then resume the slide show presentation provided by the present invention.

Item Navigation

The system 10 of the present invention may be used to achieve item navigation of a plurality of web site addresses. Item navigation is most applicable to a listing of search results from a World Wide Web search engine or other knowledge base/data base search program (e.g., keyword search, list box, category reference, etc.). An example of a typical listing of search results from a search engine is presented in FIG. 9. As shown, each of the results provides a linked web site address 86 and a snippet 88 of the web site containing the search terms from the user's search query. Snippet 88 provides only a minor insight into the actual overall content of the web site. As such, the user must select each link to access the web site for review and determination of relevance to the user's interest. To access yet another search result link, the user must return to the list of search results and select another web site for review; a tedious and time consuming process.

Figure 11:
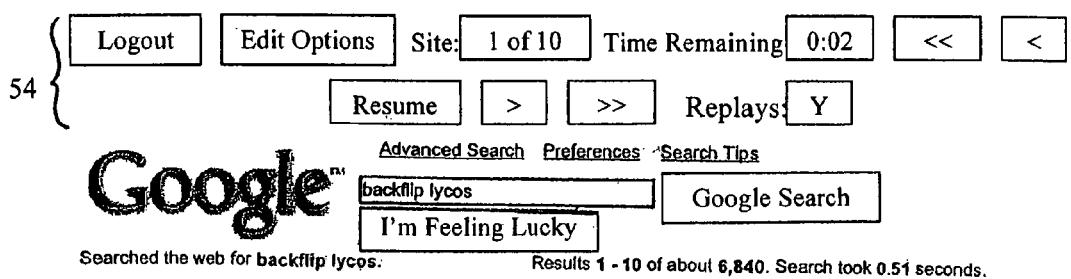
FIG. 11 depicts the search result list of FIG. 9, wherein the present invention has been invoked, provides a display screen, and presents a slide show of the addresses within the search result list.

However, upon invoking the present invention, e.g., by selecting the activator 84, the various links within the search result listing are written to web site list field 42 by automatic operation of the composer 12 and an application programming interface that integrates with site-based search functions, and a slide show presentation of the various pages of the search result listing may begin. An example of an item navigation web site address list, wherein the plurality of links corresponds to a list of search results, is presented in FIG. 10. Once the present invention is invoked, the user need not return to the results list to access the next item. Each page is presented automatically, per FIG. 11, wherein display screen 50 incorporating web site display area 52 and system-interactive user area 54 is presented to the user through the operation of the performer 14. The user may, of course, pause on those pages they find interesting and/or relevant, then resume the automated presentation.

The present invention may be used to achieve one, two or all and/or a combination of the above-described manners of navigation including those situations where one type of navigation is embedded within another type of navigation. Of course, the present invention may be used to implement other manners of navigation without departing from the spirit or scope of the invention. Furthermore, each of the presentations viewed may be additionally enhanced with an audio overlay.

Thus, in view of the above, it can be seen that besides guiding visitors more quickly to relevant content, the present invention virtually eliminates the attention that visitors normally invest in pointing, clicking, and scrolling through web pages. As such, visitor satisfaction and productivity is increased, i.e., visitors to a web site stay longer, absorb more information, and return more quickly. The model of a passive site and active visitor clicking through pages is replaced by the adaptive presentation model of active site and active visitor. In this active site/active visitor model the site owner or developer can offer a range of tours through a site wherein each tour is adapted to the interests of a wide range of target audiences. Meanwhile, the visitor can have single-click control for pausing at any page to delve more deeply into available content and can also control the pace of presentation as well as select another presentation. Instead of actively pursuing random paths through web sites one click at a time, visitors now have a choice. They can relax and enjoy one or many pre-established presentations—all with the option of stopping and/or diverting anytime they encounter interesting content.

The present invention may be embodied in other specific forms without departing from the spirit of the essential attributes thereof; therefore, the illustrated embodiments should be considered in all respects as illustrative and not restrictive, reference being made to the appended claims rather than to the foregoing description to indicate the scope of the invention.

What is claimed:

1. A customizable web site access system, comprising:
    a host server comprising
        a composer to create a presentation by accepting a list of a plurality of URLs, a desired sequence of display of said plurality of URLs, and a pre-set display duration for each of said plurality of URLs, wherein the composer is adapted to provide a plurality of list acceptance methodologies, and wherein the plurality of list acceptance methodologies comprises manual entry via a user interface portion of the composer and automatic entry by a query-based system; and
        a performer to automatically present the created presentation in a slide show format according to said list and said desired sequence, wherein each of said plurality of URLs comprises a slide within said created presentation and wherein each slide is automatically presented, absent human intervention, for said pre-set display duration as at least a portion of a web page;
    a composer invoker remote from said host server to activate said composer and provide said list, said desired sequence, and said pre-set display duration; and
    a performer invoker remote from said host server to activate said performer and display said created presentation.

2. The system of claim 1, wherein said performer provides a user control panel through the performer invoker.

3. The system of claim 2, wherein said user control panel enables the pausing and stopping of said presentation.

4. The system of claim 2, wherein said user control panel enables a user change to said desired sequence or a user change to said display duration.

5. The system of claim 1, wherein said list comprises at least one of horizontal navigation of a plurality of web sites unrelated to each other by a URL, vertical navigation of a plurality of related URLs within a web site and item navigation of a plurality of URLs related as results of a query.

6. The system of claim 1, wherein said performer is automatically activated by entry into a web site through user-entry of a URL in the performer invoker, by activation of a hyper-link in the performer invoker, by activation in the performer invoker of a hyper-link embedded in an e-mail message, or by selection in the performer invoker of one of a plurality of presentations from a gallery.

7. The system of claim 1, wherein said presentation is stored on said host server for access by web users.

8. The system of claim 1, wherein said presentation includes an audio overlay.

9. The system of claim 1, wherein the performer invoker comprises a web browser.

10. The system of claim 1, wherein the composer invoker comprises a web browser.

11. A method for customizing access to a plurality of web sites, said method comprising the steps of:
    remotely invoking a composer operating on a host server;
    creating a presentation in said composer, wherein said step of creating comprises the steps of:
        establishing a list of URLs in said composer by one of a plurality of list establishment methodologies the plurality of list establishment methodologies comprising manual entry via a user interface portion of the composer and automatic entry by a query-based system;
        determining a display sequence of said list of URLs in said composer;
        determining a duration of display for said list of URLs in said composer;
    remotely invoking a performer operating on said host server to present said created presentation; and
    automatically locally displaying the created presentation presented by said performer in a slide show format according to said list and said display sequence, wherein each of said plurality of URLs comprises a slide within said created presentation, and wherein each slide is automatically displayed to a user, absent human intervention, for the pre-determined display duration as at least a portion of a web page.

12. The method of claim 11, further comprising the step of locally displaying a control panel to control the created presentation being displayed.

13. The method of claim 12, further comprising the step of utilizing said control panel to pause or stop the created presentation being displayed.

14. The method of claim 12, further comprising the step of utilizing said control panel to change said display sequence or to change said duration of display.

15. The method of claim 11, wherein said list comprises at least one of horizontal navigation of a plurality of web sites unrelated to each other by a URL, vertical navigation of a plurality of related URLs within a web site, and item navigation of a plurality of URLs related as results query.

16. The method of claim 11, wherein said step of displaying is automatically activated by entry into a web site through local user-entry of a URL, by local activation of a hyper-link, by local activation of a hyper-link embedded within an e-mail message, or by local selection of one of a plurality of presentations from a gallery stored on said server.

17. The method of claim 11, wherein said presentation is stored on said host server for access by web users.

18. The method of claim 11, wherein said presentation includes an audio overlay.

19. The method of claim 11, wherein the step of remotely invoking a performer operating on said host server to present said created presentation further comprises remotely invoking the performer by a web browser function.

20. The method of claim 11, wherein the step of remotely invoking a composer operating on a host server further comprises remotely invoking the composer by a web browser function.

21. A software program recorded on a machine-readable medium to customize and automate web site navigation, said software program operating on a host serve said software program comprising:
   means for establishing a desired list of comprising manual entry means for entering a desired list of via a user interface and automatic entry means for automatically creating a desired list of URLs from a result of a query-based system;
   means for establishing a sequence of display of said desired list of URLs;
   means for establishing a duration of display of said desired list of URLs; and
   means for automatically presenting for display at a location remote from the server said desired list of IJRL: in a slide show format according to the established sequences, wherein each of said URLs comprises a slide within the slide show, and wherein each slide is automatically displayed to a user, absent human intervention, for the established duration of display as at least a portion of a web page.

22. The software program of claim 21, further comprising means for controlling the displaying URLs.

23. The software program of claim 22, wherein said means for controlling comprises means for pausing the displaying URLs or means for stopping the displaying URLs, said means for controlling displayed at a location remote from the server.

24. The software program of claim 22, wherein said means for controlling comprises means for changing the established sequence of display or for changing the established duration of display, said means for controlling displayed at a location remote from the server.

25. The software program of claim 21, wherein the established sequence of display comprises at least one of horizontal navigation of a plurality of web sites unrelated to each other by a URL, vertical navigation of a plurality of related URLs within a web site and item navigation of a plurality of URLs related as results of a query.

26. The software program of claim 21, wherein said means for automatically displaying is activated by entry into a web site through user-entry of a URL, by user-activation of a hyper-link, by user-activation of a hyperlink embedded in an e-mail message, or by selection of a pre-established list of URLs from a gallery.

27. The software program of claim 21, wherein said desired list of URLs is stored on the host server for access by web users.

28. The software program of claim 21, further comprising means for providing an audio overlay.

29. A customizable web site access system, comprising:
   a host server comprising
      a composer to create a presentation by accepting a list of a plurality of URLs, a desired sequence of display of said plurality of URLs, and a pre-set display duration for each of said plurality of URLs, wherein the composer is adapted to provide a plurality of list acceptance methodologies, and wherein the plurality of list acceptance methodologies comprises manual entry via a user interface portion of the composer and automatic entry by a query-based system; and
      a performer to automatically present the created presentation in a slide show format according to said list and said desired sequence, wherein each of said plurality of URLs comprises a slide within said created presentation and wherein each slide is automatically presented, absent human intervention, for said pre-set display duration as at least a portion of a web page;
   a composer invoker remote from said host server, said composer invoker comprising a composer web browser, wherein said list, said desired sequence, and said pre-set display duration are provided in said composer web browser and transmitted through said composer web browser to activate said composer to create said presentation; and
   a performer invoker remote from said host server, said performer invoker comprising a performer web browser to reach a web site to activate said performer, wherein said performer web browser displays said created presentation presented by said performer.

30. The system of claim 29, wherein said list comprises at least one of horizontal navigation of a plurality of web sites unrelated to each other by a URL, vertical navigation of a plurality of related URLs within a web site, and item navigation of web sites.

31. The system of claim 30, wherein said list and said desired sequence are provided in said composer web browser as an item navigation search engine results list and are automatically transmitted through said composer web browser to invoke said composer.

32. The system of claim 29, wherein said performer provides a control panel in said performer web browser.

33. The system of claim 32, wherein said control panel enables the pausing and stopping of said presentation.

34. The system of claim 32, wherein said control panel enables a user change to said desired sequence or a user change to said display duration.

35. The system of claim 29, wherein said created presentation is stored on said host server.

36. The system of claim 29, wherein said performer is automatically activated by entry into a web site through user-entry of a URL in the performer invoker, by activation of a hyper-link in the performer invoker, by activation in the performer invoker of a hyper-link embedded in an e-mail message, or by selection in the performer invoker of one of a plurality of presentations from a gallery.

* * * * *